United States Patent [19]

Sakano

[11] 4,369,412
[45] Jan. 18, 1983

[54] AUDIO AMPLIFIER

[75] Inventor: Hideki Sakano, Iwafunemachi, Japan

[73] Assignee: Tokyo Shibaura Denki Kabushiki Kaisha, Japan

[21] Appl. No.: 197,948

[22] Filed: Oct. 17, 1980

[30] Foreign Application Priority Data

Feb. 5, 1980 [JP] Japan ................................. 55-12667

[51] Int. Cl.³ ............................................. H02H 7/20
[52] U.S. Cl. ..................................... 330/298; 330/51;
330/112; 330/207 P; 330/291
[58] Field of Search ..................... 330/51, 112, 207 P,
330/298, 291; 179/1 A, 1 F

[56] References Cited
U.S. PATENT DOCUMENTS 3,838,352 9/1974 Dolby et al. .................. 330/112 X Primary Examiner—James B. Mullins
Attorney, Agent, or Firm—Finnegan, Henderson, Farabow, Garrett & Dunner

[57] ABSTRACT

An audio amplifier having an auxiliary terminal for connection of a feedback line to the grounded terminal of a loudspeaker and including a circuit for protection against voltage overload on the amplifier and loudspeaker if the auxiliary terminal is inadvertently connected to the ungrounded terminal of the loudspeaker, or in case of malfunction of the feedback circuit. The protection circuit includes a signal generator activated by the closing of a power switch for circuiting a check signal through the terminals of the loudspeaker to the auxiliary terminal and a controller sensitive to the voltage at the auxiliary terminal for controlling a switch for muting the output of the amplifier if the voltage at the auxiliary terminal exceed a predetermined value.

7 Claims, 4 Drawing Figures

AUDIO AMPLIFIER

FIELD OF THE INVENTION

This invention relates to an audio amplifier, and more particularly, to an audio amplifier which has a compensating circuit for a counter electromotive force of a loudspeaker connected to it.

BACKGROUND OF THE INVENTION

A great number of improvements in audio equipment, for example, amplifiers or loudspeakers, have been made to produce sound of higher fidelity. As a result, a recent amplifier or loudspeaker, individually, produces a good performance. However, when the amplifier and loudspeaker are combined, impedance mismatching between the amplifier and loudspeaker becomes a problem. That is, the impedance of the extension wires connecting the amplifier and the loudspeaker together, adds to the impedance of the loudspeaker so that an output impedance of the amplifier becomes difficult to match with the whole of the load impedance, including the impedance of the loudspeaker and the extension wires. In such an impedance mismatching condition, an output signal voltage of the amplifier, as well as a counter electromotive force voltage of the loudspeaker arises across the loudspeaker terminals. The counter electromotive force voltage has non-linearity characteristics so that the loudspeaker is driven by the output signal voltage which is distorted by the counter electromotive force voltage.

Heretofore, an audio amplifier having a circuit automatically compensating a counter electromotive force of a loudspeaker by means of feedback has been rarely considered. Moreover, it has been found that users may inadvertently connect the audio amplifier to the wrong side of the loudspeaker resulting in the breakdown of the amplifier or the loudspeaker.

SUMMARY OF THE INVENTION

Accordingly, an object of the present invention is to provide an audio amplifier having a circuit compensating automatically for a counter electromotive force voltage of a loudspeaker connected to the audio amplifier and for preventing any abnormality in voltage caused by a misconnection from damaging the audio amplifier and the loudspeaker.

Another object of the present invention is to provide an audio amplifier having a circuit for protecting against any abnormality caused by a malfunction of a circuit compensating for a counter electromotive force voltage of a loudspeaker connected to the audio amplifier.

A further object of the present invention is to provide an audio amplifier which mutes an abnormal sound produced by a loudspeaker connected to the audio amplifier in consequence of a malfunction of a circuit compensating for a counter electromotive force voltage of the loudspeaker.

The objects of the present invention are accomplished by an audio amplifier for connection to a pair of terminals of a loudspeaker through like individual extension wires comprising a line input terminal, a line amplifier having an input terminal connected to the line input terminal, a line output terminal for connection to one of the terminals of the loudspeaker through one of the extension wires, a grounded terminal for connection to the other of the terminals of the loudspeaker through the other of the extension wires, an auxiliary terminal for connection to the grounded terminal of the loudspeaker, a positive feedback circuit connected between the auxiliary terminal and the input terminal of the line amplifier and apparatus for protecting the line amplifier and loudspeaker from damage by voltage overload including: (a) a switch between the output of the line amplifier and the line output terminal; and (b) controller means sensitive to the voltage at the auxiliary terminal for opening, or maintaining open, the switch when said voltage exceeds a predetermined value.

Preferably, the audio amplifier of the invention also includes a low voltage check signal generator and the switch includes a first stationary contact connected to the output of the line amplifier, a movable contact connected to the line output terminal, and a second stationary contact connected to the check signal generator, the controller means connecting the movable contact to the second stationary contact when the voltage at the auxiliary terminal exceeds the predetermined value.

In addition, it is preferred that the check signal is inaudible on the loudspeaker, but the voltage of the check signal is higher than the predetermined value plus the total of the impedance of one of the like extension wires and the connection between the auxiliary terminal and the grounded terminal of the loudspeaker, and less than the latter total impedance, plus the impedance between the pair of terminals of the loudspeaker.

Additional objects and advantages of the present invention will become apparent to persons skilled in the art from a study of the following description of the accompanying drawings, in which

DESCRIPTION OF THE PREFERRED EMBODIMENT

Figure 1:
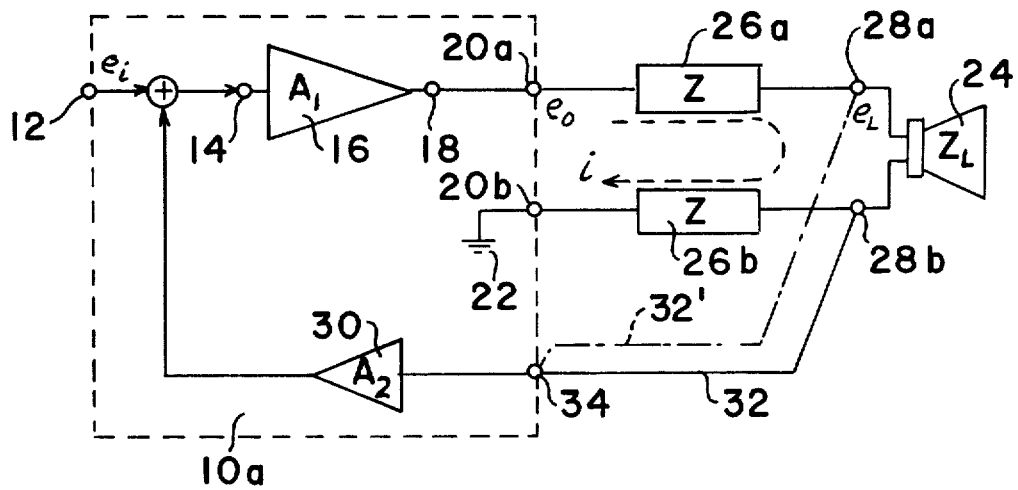
FIG. 1 shows a block diagram of a conventional sound reproduction system including a basic audio amplifier to which the present invention is an improvement.

The present invention will be described in detail with reference to the accompanying drawings FIG. 1 to FIG. 4. Throughout the drawings, like reference numerals will be used to designate like or equivalent portions, for the sake of simplicity of explanation.

Referring now to FIG. 1, there is shown a sound reproduction system including a prior art audio amplifier to which this invention is an improvement. In FIG. 1, an audio amplifier 10a within a broken line is characterized by having a positive feedback means. A line input signal at a line input terminal 12 is supplied to an input terminal 14 of a line amplifier 16. An amplified signal derived from an output terminal 18 of line amplifier 16 is supplied to a line output terminal 20a. Output terminal 20b is grounded. The line output signal arising across line output terminals 20a and 20b is supplied to a loudspeaker 24 through a pair of like extension wires 26a and 26b. One loudspeaker terminal 28b which is connected to grounded output terminal 20b is further connected to a positive feedback circuit 30 in audio amplifier 10a through a feedback wire 32. Thus, a signal voltage at loudspeaker terminal 28b is positively fed back to the input of line amplifier 16.

In the above-described sound reproduction system, positive feedback circuit 30 may compensate the driving signal for loudspeaker 24. That is, if $e_o$, $e_L$, $Z$ and $Z_L$ denote the output voltage of audio amplifier 10a, i.e., the driving voltage supplied to loudspeaker terminals 28a and 28b, the impedance of each of the like extension wires 26a or 26b, and the impedance of loudspeaker 24, respectively, then the following equation is obtained referring to the voltage $e_L$.

$$e_L = \frac{e_o \cdot Z_L}{2Z + Z_L} \tag{1}$$

If again, $e_i$, $i$, $A_1$ and $A_2$ denote an input signal voltage for audio amplifier 10a at line input terminal 12, output current flowing through extension wires 26a and 26b and loudspeaker 24 and amplification degrees of line amplifier 16 and positive feedback means 30, respectively, then the following equation is obtained referred to the voltage $e_o$:

$$e_o = (e_i + A_2 i Z) A_1 \tag{2}$$

$$= \left( e_i + A_2 Z \cdot \frac{e_o}{2Z + Z_L} \right) A_1$$

The equation (2) may be rearranged as follows:

$$e_o = \frac{e_i \cdot A_1}{\left( 1 - A_1 \cdot A_2 \cdot \frac{Z}{2Z + Z_L} \right)} \tag{3}$$

Then, the equation (1) may be rewritten as follows by substituting the equation (3):

$$e_L = \frac{e_i \cdot A_1}{\left( 1 - A_1 \cdot A_2 \cdot \frac{Z}{2Z + Z_L} \right)} \cdot \frac{Z_L}{2Z + Z_L} \tag{4}$$

$$= \frac{e_i \cdot A_1 \cdot Z_L}{Z_L + 2Z - A_1 A_2 Z}$$

In equation (4), the voltage $e_L$ persists regardless of loudspeaker impedance $Z_L$, under the condition that the following equation (5) is obtained:

$$2Z - A_1 A_2 \cdot Z = 0,$$

that is, $$A_1 \cdot A_2 = 2 \tag{5}$$

In the above equation, the voltage $e_L$ is presented by the special equation (6) as follows:

$$e_L = A_1 \cdot e_i \tag{6}$$

From the relation (6), the following description may be made. That is, driving voltage $e_L$ at terminals 28a and 28b for loudspeaker 24 relates only to the amplification degree $A_1$ of line amplifier 16 and does not relate to the loudspeaker impedance $Z_L$ and the impedance of extension wires 26a and 26b. This means that the sound reproduced from loudspeaker 24 is free from any distortion accompanying a change of the loudspeaker impedance $Z_L$.

However, it becomes clear that the sound reproduction system has a problem. That is, the whole system may be thrown into an abnormal oscillating condition by a violent positive feedback with the result that the loudspeaker or the line amplifier is damaged by an increased oscillating voltage. Such a situation arises when feedback wire 32 is connected to the ungrounded loudspeaker terminal 28a, as shown by a dotted line 32' in FIG. 1. whereby the feedback quantity by positive feedback circuit 30 becomes so large that the operative condition of the whole system goes into positive feedback condition. Then the following equation (7) is obtained:

$$e_o \approx A_1 \cdot (e_i + A_2 \cdot e_o) \tag{7}$$

The equation (7) may be further changed as follows:

$$e_o = \frac{A_1}{1 - A_1 \cdot A_2} \cdot e_i$$

If the product $A_1 A_2$ is set for two, then the following equation (8) is obtained.

$$e_o = -A_1 \cdot e_i \tag{8}$$

Figure 2:
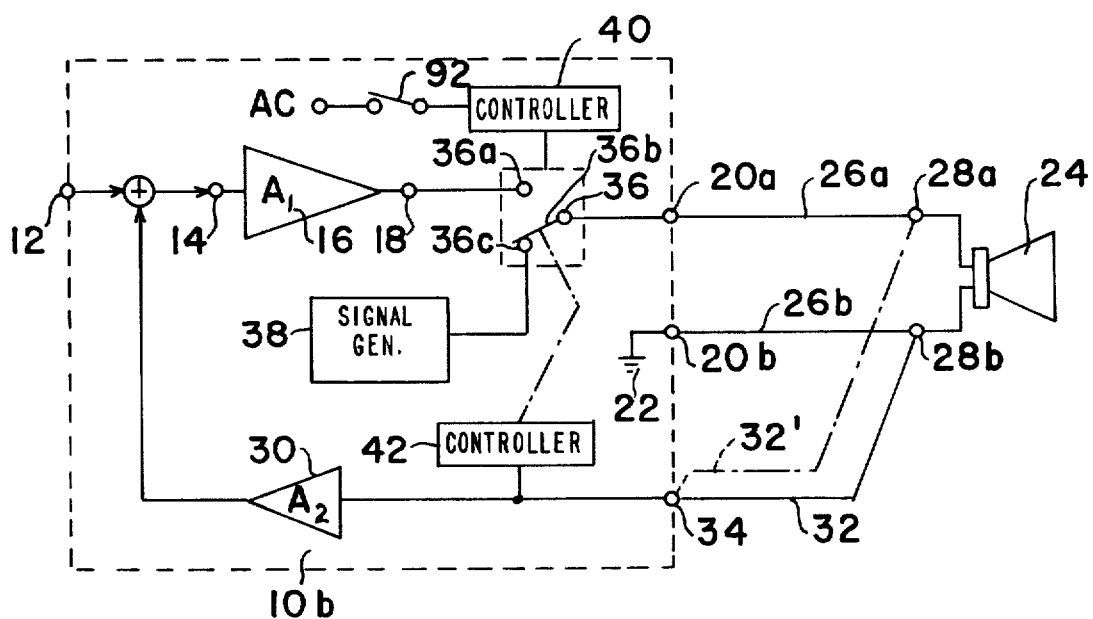
FIG. 2 shows a block diagram of a sound reproduction system including the audio amplifier according to the present invention.

Referring now to FIG. 2, there is shown in block diagram a sound reproduction system, including an audio amplifier according to this invention, in which a loudspeaker is connected to the audio amplifier. The audio amplifier is designated by a reference numeral 10b. As shown in FIG. 1, input terminal 12 is connected to input terminal 14 of line amplifier 16. Output terminal 18 of line amplifier 16 is connected to line output terminal 20a and output terminal 20b is grounded. Also as in FIG. 1, output terminals 20a and 20b are connected to loudspeaker 24 via the pair of like extention wires 26a and 26b. One loudspeaker terminal 28b connected to grounded terminal 20b is further connected to positive feedback circuit 30 in audio amplifier 10b through feedback wire 32, and feedback wire 32 is connected between one loudspeaker terminal 28b and an auxiliary terminal 34 of audio amplifier 10b. Then positive feedback circuit 30 is connected to input terminal 14 of line amplifier 16.

In addition, a single pole double throw switch 36 is provided between output terminal 18 of line amplifier 16 and line output terminal 20a. A first stationary contact 36a of switch 36 is connected to output terminal 18 of line amplifier 16 and a movable contact 36b of switch 36 is connected to line output terminal 20a. Then, a second stationary contact 36c of switch 36 is connected to a check signal generator 38. Movable contact 36b is biased to second stationary contact 36c.

For the movable contact 36b, a pair of controllers 40 and 42 are provided. First controller 40 is electrically linked to a power supply switch 92 (FIG. 3) of audio amplifier 10b and activates movable contact 36b to be connected to first stationary 36a after a delay as will be explained hereinafter. The delay is provided for muting the sound reproduction system for a short predetermined warm-up period before the signal from line amplifier 16 is applied to loudspeaker 24.

Second controller 42 is connected to auxiliary terminal 34, and activates movable contact 36b to second stationary contact 36c when the voltage level on on auxiliary terminal 34 exceeds a predetermined level.

Now the operation of the sound reproduction system shown in FIG. 2 will be explained. When power supply switch 92 has been closed, movable contact 36b in double throw switch 36 is already connected to second stationary contact 36c by a bias on movable contact 36b. Therefore, a low voltage check signal is applied to loudspeaker 24 from check signal generator 38, as will be explained with reference to FIG. 3. The check signal flows to ground through extension wire 26a, loudspeaker 24 and extension wire 26b in order.

The voltage level of the check signal is set to be higher than the predetermined maximum permissable voltage at auxiliary terminal 34 plus the combined impedance of an extension wire 26a, 26b and the connection 32 between terminal 28b and auxiliary terminal 34, but less than the combined impedance plus the impedance between the terminals 28a, 28b, of the loudspeaker.

Thus, if the line 32 is properly connected to terminal 28b, the signal level of the check signal appearing at auxiliary terminal 34 will be less than the predetermined value and controller 42 will permit controller 40 to move movable contact 36b from stationary contact 36c to stationary contact 36a after the predetermined delay.

On the other hand, if line 32 is improperly connected to terminal 28a, the voltage appearing at auxiliary terminal 34 will exceed the predetermined value and controller 42 will not permit controller 40 to move contact 36b from stationary contact 36c to stationary contact 36a.

In other words, controller 40 is subject to controller 42 for preventing a damaging voltage from being applied to line amplifier 16 and loudspeaker 24 if line 32 is connected to ungrounded terminal 28a of loudspeaker 24.

Figure 3:
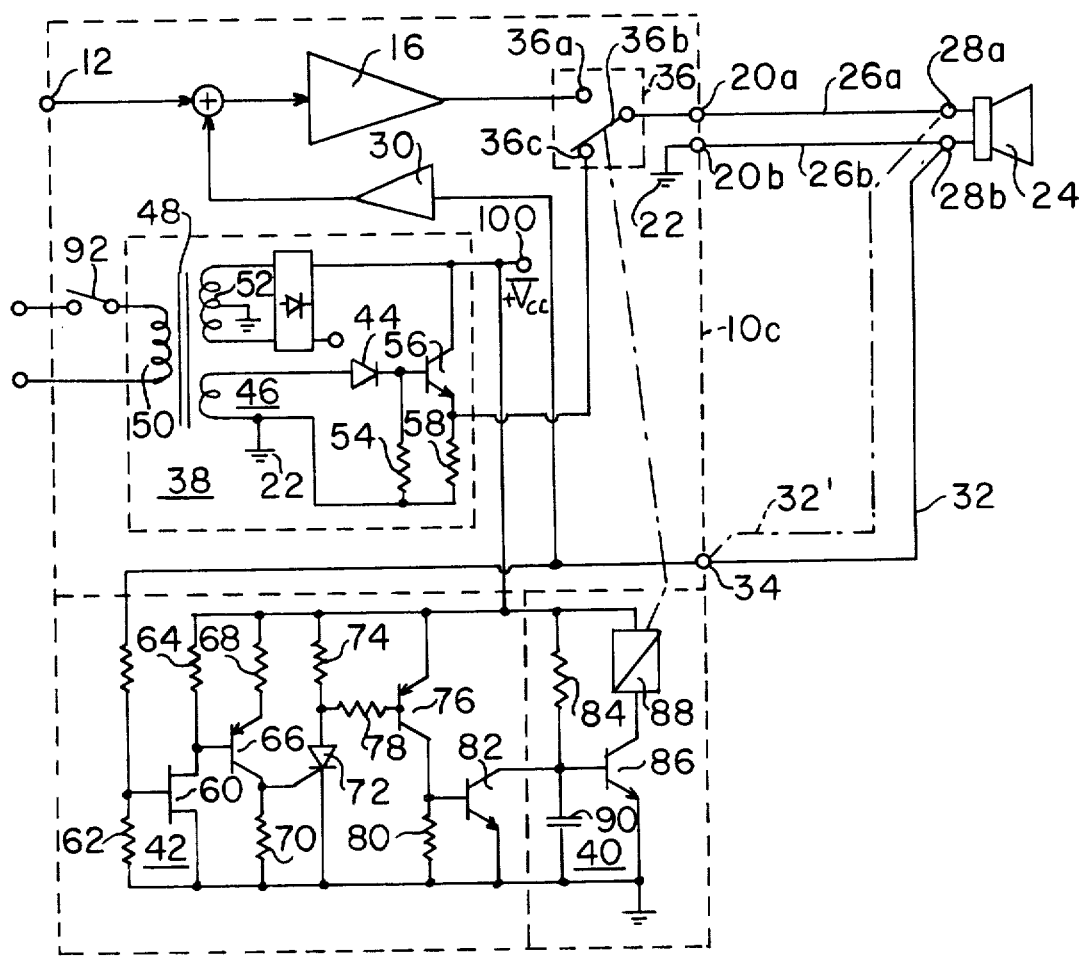
FIG. 3 shows a circuit diagram of a sound reproduction system including an audio amplifier which embodies the present invention.

FIG. 3 shows a circuit diagram of a sound reproduction system in which the check signal generator and the controllers for the audio amplifier according to the present invention are drawn in detail. Line amplifier 16, a single pole double throw switch 36, loudspeaker 24 and positive feedback circuit 30 are connected as shown in FIG. 2.

Check signal generator 38 connected to second stationary contact 36c of switch 36 is constructed as a halfwave rectifier circuit. That is, a diode 44 is coupled at its anode to a secondary winding 46 of a transformer 48 which has a primary winding 50 and another secondary winding 52. The cathode of diode 44 is connected to one end of a resistor 54 the other end of which is grounded, and also connected to the base of an NPN transistor 56. Transistor 56 is coupled at its collector to DC power source 100 having a voltage +Vcc and at its emitter to ground 22 through a resistor 58. The emitter of transistor 56 is also connected to second stationary contact 36c of switch 36.

Accordingly, a halfwave current rectified from a commercial AC power source is obtained on the cathode of diode 44. The halfwave current is properly regulated at its amplitude by transistor 56. Thus, the regulated halfwave current is supplied to second stationary contact 36c of switch 36 as a check signal.

A controller 42 for double throw switch 36 is constructed as below. The gate of a field-effect transistor (FET) 60 is connected to auxiliary terminal 34 and one end of a resistor 62 of which the other end is grounded. FET 60 is coupled at its drain to DC power source 100 through a resistor 64 and at its source to ground 22. The drain of FET 60 is further connected to the base of PNP transistor 66. PNP transistor 66 is coupled at its emitter to DC power source 100 through a resistor 68 and at its collector to ground 22 through a resistor 70. The collector of transistor 66 is further connected to the gate of a silicon controlled rectifier (SCR) 72. SCR 72 is coupled at its anode to DC power source 100 through a resistor 74 and at its cathode to ground 22. The anode of SCR 72 is further connected to the base of a PNP transistor 76 through a resistor 78. Transistor 76 is coupled at its emitter to DC power source 100 and at its collector to ground 22 through a resistor 80. The collector of transistor 76 is further connected to a base of an NPN transistor 82. Transistor 82 is coupled at its collector to DC power source 100 through a resistor 84 and at its emitter to ground 22. The collector of transistor 82 is further connected to a base of an NPN transistor 86. Transistor 86 is coupled at its collector to DC power source 100 through a relay coil 88 and at its emitter to ground 22. The base of transistor 86 is further connected to ground 22 through a capacitor 90.

Accordingly, when power switch 92 inserted into the primary winding circuit of the transformer has been closed, charging for capacitor 90 is started. The charging current flows into capacitor 90 from DC power source 100 through resistor 84. Before the base potential of transistor 86 reaches a turn-on voltage, transistor 86 is in OFF state, and then a relay controlled contact, that is, the biased movable contact 36b of double throw switch 36, is still connected to second stationary contact 36c side since relay coil 88 has not yet been activated. Therefore, audio amplifier 10c is muted for a predetermined period. The muting period is determined by a time constant according to a resistance of resistor 84 and capacitance of capacitor 90.

During the muting period, the check signal is supplied from the emitter of transistor 56 to line output terminal 20a through switch 36. Therefore, if feedback wire 32 is rightly connected to grounded terminal 28b of loudspeaker 24, the check signal comes out at auxiliary terminal 34 as low potential. So, transistors 60, 66, 76 and 82 and SCR 72 are in OFF condition. As a result, after the charged voltage in capacitor 90, as the base potential of transistor 86, exceeds a threshold level, transistor 86 turns to ON condition and relay coil 88 activates movable contact 36b to connect to first stationary contact 36a. Accordingly, the muting operation for line amplifier 16 is reviewed. However, if feedback wire 32 is connected to ungrounded terminal 28a of loudspeaker 24 in error, as shown on the dotted line 32', the check signal is not affected by the impedance of the loudspeaker and comes out on auxiliary terminal 34 as relatively high potential. So, transistors 60, 66, 76, 82 and SCR 72 turn to ON conditions. However, SCR 72 keeps its ON condition by only one pulse in the halfwave current so that transistor 82 may also keep its ON condition. Therefore, the base potential of transistor 86 fails to rise which results in transistor 86 being kept in OFF condition. As a result, the muting operation for the sound reproduction system is held and the dangerous positive feedback condition otherwise resulting from the misconnecting of feedback wire 32 to loudspeaker 24 is prevented. In addition, loudspeaker 24 continues to produce an inaudible sound because the check signal comprises an inaudible low frequency commercial AC current.

Hereinbefore, the circuit including resistor 84, capacitor 90, transistor 86 and relay 88 corresponds to first controller 40 in FIG. 2. On the other hand, the circuit including transistor 66, 76, 82 and 86, SCR 72 and relay 88 corresponds to second controller 42 in FIG. 2. The former circuit is subject to the latter circuit.

Figure 4:
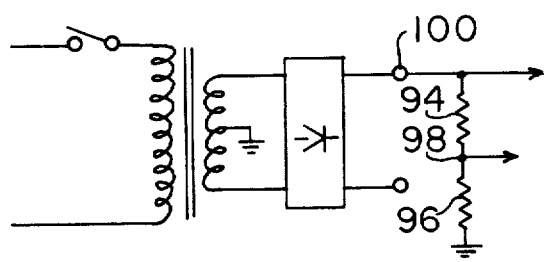
FIG. 4 shows a second embodiment of a check signal generator which may be substituted for the check signal generator included in the audio amplifier of FIG. 3.

FIG. 4 shows a different check signal generator for use in the audio amplifier according to the present invention. In this modification, the check signal is a low level DC current divided from DC power source 100. That is, a pair of resistors 94 and 96 are connected in series between DC power source 100 and ground 22. Then, a connecting node 98 between resistors 94 and 96 is connected to second stationary contact 36c of double throw switch 36. Accordingly, a low level DC current is supplied from node 98 to second stationary contact 36c as the check signal.

What is claimed is:

1. An audio amplifier for connection to a pair of terminals of a loudspeaker through like individual extension wires comprising:
    a line input terminal;
    a line amplifier having an input terminal connected to the line input terminal;
    a line output terminal for connection to one of the terminals of the loudspeaker through one of the extension wires;
    a grounded terminal for connection to the other of the terminals of the loudspeaker through the other of the extension wires;
    an auxiliary terminal for connection to the grounded terminal of the loudspeaker;
    a positive feedback circuit connected between the auxiliary terminal and the input terminal of the line amplifier; and
    apparatus for protecting the line amplifier and loudspeaker from damage by voltage overload including:
    (a) a switch between the output of the line amplifier and the line output terminal; and
    (b) controller means sensitive to the voltage at the auxiliary terminal for opening or maintaining open, said switch when said voltage exceeds a predetermined value.

2. The audio amplifier of claim 1 further comprising:
    means for supplying a low voltage check signal and wherein said switch includes a first stationary contact connected to the output of the line amplifier, a movable contact connected to the line output terminal, and a second stationary contact connected to the check signal supplying means, and said controller means connects said movable contact to said second stationary contacts when said voltage at the auxiliary terminal exceeds said predetermined value.

3. The audio amplifier of claim 2 further comprising power means, said power means including said check signal supplying means, and delay controller means for moving said movable contact from said second stationary contact to said first stationary contact after a predetermined time period after the activation of said power means, said delay controller means being subject to said controller means.

4. An audio amplifier according to claim 2 or claim 3 wherein said check signal is inaudible on said loudspeaker, but the voltage of the check signal is higher than the predetermined value plus the total of the impedance of one of said extension wires and said connection between said auxiliary terminal and the grounded terminal of the loudspeaker, and less than the voltage of the predetermined value and said total impedance plus the impedance between the pair of terminals of the loudspeaker.

5. An audio amplifier according to claim 4 wherein said inaudible signal is a low frequency range signal.

6. An audio amplifier according to claim 4, wherein said inaudible signal is a halfwave rectified current of a commercial frequency current.

7. An audio amplifier according to claim 4 wherein said inaudible signal is a direct current.

* * * * *